United States Patent [19]
Gay

[11] 4,055,818
[45] Oct. 25, 1977

[54] TONE CONTROL CIRCUIT
[75] Inventor: Michael J. Gay, Geneva, Switzerland
[73] Assignee: Motorola, Inc., Schaumburg, Ill.
[21] Appl. No.: 675,396
[22] Filed: Apr. 9, 1976
[51] Int. Cl.² ............................................. H03H 7/10
[52] U.S. Cl. ................................ 333/28 T; 179/1 D; 307/264; 330/151
[58] Field of Search ..................... 333/14, 28 T, 17 R, 333/28 R; 307/264; 179/1 D, 1 F; 330/151; 334/8

[56] References Cited
U.S. PATENT DOCUMENTS

| 3,921,104 | 11/1975 | Gundry | 333/28 T |
| 3,972,010 | 7/1976 | Dolby | 333/14 |

Primary Examiner—Paul L. Gensler
Attorney, Agent, or Firm—Michael D. Bingham

[57] ABSTRACT

Circuits for a high fidelity sound reproducing system which are suitable for providing treble, bass tone boost and cut functions. The audio input signal is utilized for producing a signal having the magnitude thereof frequency dependent. This frequency dependent signal is divided by a splitter circuit into feedback and feed forward signals and combined with the audio signal to either decrease or increase the magnitude of the audio signal appearing at an output thereof as a function of frequency. The ratio of feedback to feed forward signals produced by the splitter circuit is controlled by a direct current (DC) control voltage applied thereto. Because the control of the frequency dependent signals to vary the function of the circuit is accomplished elsewhere than in signal path of the audio signal the circuit is suitable for providing tone control remotely.

18 Claims, 4 Drawing Figures

TONE CONTROL CIRCUIT

BACKGROUND OF THE INVENTION

This invention relates to electronic control circuits and more particularly to a tone control circuit for a high fidelity sound reproduction receiver or the like.

The best known tone control circuit of the prior art is the Baxandall circuit which is the basis for many tone controls used in high fidelity sound reproducing equipment. Fundamentally, the Baxandall circuit is used for varying the treble and bass tones by varying the frequency response of an alternating current signal path to an amplifier circuit. The treble control causes the high frequency response to be either increased or decreased with respect to the middle and low frequencies. The base control provides the same type of control to the low frequencies with respect to the middle and high frequencies. The basic circuit comprises two linear potentiometers, three resistors, and three capacitors connected between an input terminal, and, for example, the base to emitter electrodes of a transistor amplifier. One such circuit is required for each channel of a high fidelity reproduction system. Thus, for a two channel stereo system, to control the treble and bass tones would require at least four potentiometers, six resistors, and six capacitors. It is necessary that each pair of potentiometers (two each for treble tones and two each for bass tones) be ganged together. As the number of channels increases the number of potentiometers to be ganged together increases as well as the total number of the components such as the capacitors and resistors comprising the circuit.

One disadvantage of the above circuit is that each ganged potentiometer must be matched with its pair or pairs otherwise the fidelity of the stereo system may suffer. Matching potentiometers becomes expensive and even increases, expectedly, as the number of channels constituting the stereo system increase. Furthermore, the excessive number of capacitors required also increases the expense of stereo systems utilizing the circuit of the prior art.

Another disadvantage of the prior art circuit is that tone control is accomplished in the alternating current signal path, i.e., the potentiometers attenuate the actual audio signal being reproduced in the high fidelity system. This presents a major problem in the design and layout of the high fidelity system. One of the worst problems facing a high fidelity system manufacturer is the running of leads from, for example, a printed circuit board to each potentiometer of the tone control circuit. As the number of ganged potentiometers in the tone control circuit increases as the number of channels increases, so does the number of leads required to be carried to the potentiometers. Because all of the leads to the potentiometers are carrying the audio signal, they are susceptable to hum pick-up from the power supply and other sources. The leads cannot be decoupled because they are carrying the audio signals and therefore the whole layout of the stereo system has to be designed to avoid picking up spurious signals on the leads. More often than not, the leads used in such prior art stereo systems are screen leads. Thus, the problems of layout plus the number of leads and the fact that the leads must be screened also increases the cost of the prior art circuit.

Moreover, because the prior art system requires individual potentiometers to control the treble and bass tones for each channel of the stereo system, it is not readily adaptable to be controlled by a remote control unit. There is a strong tendency for manufacturers of sound reproduction systems to provide, to the consumer, a means for remotely controlling the adjustment of the volume and well as the tone controls of the system. Thus, the consumer would have a hand held remote control unit similar to those provided for televisions, for adjusting the sound quality and volume.

Thus, a need exists for an improved tone control circuit for high fidelity reproduction system which overcomes the above problems of the prior art. Moreover, the tone control circuit of the invention is suitable to be remotely adjusted.

SUMMARY OF THE INVENTION

Accordingly, it is an object of the present invention to provide an improved tone control circuit.

It is another object of the present invention to provide a tone control circuit which is controlled by a direct current control voltage.

A further object is to provide a direct current controlled tone control circuit which can be fabricated in integrated circuit form and which requires a minimum number of external components.

A still further object is to provide a tone control circuit which is suitable for being interfaced with remote control systems.

In accordance with the foregoing and other objects, the tone control circuit configurations of the present invention are suitable for providing treble and bass tone control for high fidelity sound reproduction systems and the like. Moreover, these tone control circuits are suitable to be manufactured in monolithic integrated circuit form and to be DC controlled to facilitate remote control of the treble and bass tones of the high fidelity sound system. The tone control circuit is adapted to be coupled to an audio amplifier circuit and includes a frequency sensitive component for producing a signal having a magnitude which is frequency dependent. The frequency dependent signal is caused, in response to a DC control signal, to be either fed forward and summed with the output of the amplifier thereby increasing the audio signal as the frequency varies, or is caused to be combined with the input to the audio amplifier such that the signal thereto is decreased as a function of frequency. Thus, the output from the amplifier may be increased or decreased to either boost or cut respectively, the treble and bass tones in response to an applied DC control signal. The control circuit is not in the alternating current (AC) signal path and thus eliminates problems associated with spurious signals which might otherwise be introduced therein and which have caused audible hums to be heard in the output signal of high fidelity stereo systems.

DETAILED DESCRIPTION OF THE PREFERRED EMBODIMENTS

Figure 1:
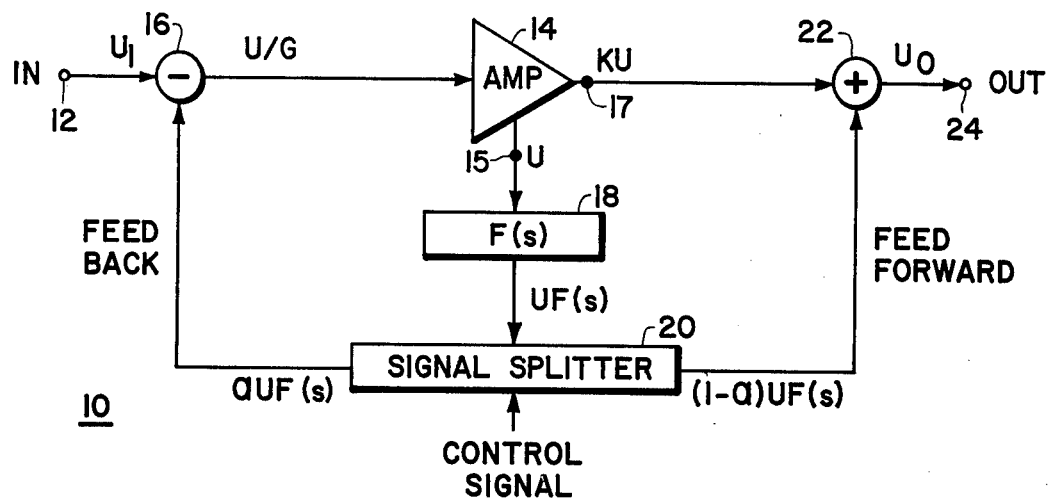
FIG. 1 is a block diagram illustrating a tone control circuit of the present invention.

Referring to FIG. 1, there is shown in block diagram form tone control circuit 10 of the present invention which is suitable to be utilized in high fidelity sound reproduction systems for controlling, for example, the treble and bass tone response characteristics. Tone control circuit 10 can be realized in various forms dependent on whether the input and output signals are chosen to be current or voltages. An input audio signal, $U_1$, is applied to input terminal 12, it is to be understood that the input signal may be either a current or voltage signal. The input signal is coupled to amplifier 14 through combiner 16. Depending on the need, it is understood that a buffer amplifier circuit (not shown) could be placed between input terminal 12 and combiner 16. An output signal from amplifier 14 appearing at terminal 15 is applied through frequency sensitive network 18. The signal produced at the output of frequency sensitive network 18 has a magnitude which is dependent on the frequency of the audio signal. The output frequency dependent signal from frequency sensitive network 18 is applied to signal splitter circuit 20 which, in response to a control signal applied thereto, will cause the frequency dependent input signal thereto to be utilized as a feedback signal to combiner 16 and as a feed forward signal applied to combiner 22 which is coupled to the other output (terminal 17) of amplifier 14. The output from combiner 22 at terminal 24 may then be applied, for example, to a power amplifier and then to the speaker of each channel of the high fidelity stereo receiver system.

Briefly, if the frequency sensitive signal applied to signal splitter 20 is fed back to combiner 16, the output at output terminal 24 may be reduced or cut. However, if the frequency sensitive signal is fed forward to combiner 22, the output signal at output terminal 24 may be increased, i.e., boosted. If, in response to the control signal applied to signal splitter 20 (which is a direct current (DC) control signal) all of the frequency sensitive signal is caused to be returned to combiner 16 (which may be a subtracting circuit) then the signal acts as a feedback signal at the input to amplifier 14. Depending on the frequency characteristic of network 18, the feedback signal can provide either a rising or falling frequency characteristic at the output of amplifier 14. If on the other hand, in response to the control signal, the output of frequency sensitive network 18 is caused to be fed forward to combiner 22, and is then added to the output from amplifier 14 either a boost or cut in the output signal occurring at output 24 can occur, depending on the frequency characteristic of frequency sensitive network 18. Still referring to FIG. 1, it can be shown that the transfer function of tone control circuit 10 is equal to:

$$\frac{U_0}{U_1} = \frac{K + (1-a)F(s)}{\frac{1}{G} + aF(s)} \quad (1)$$

where:
$G$ = gain of amplifier 14 at output 15
$GK$ = gain of amplifier 14 at output 17
$a$ = signal splitting ratio of splitter circuit 20
$F(s)$ = frequency dependency of signal from network 18

$$\text{at } a = 0 \quad \frac{U_0}{U_1} = \frac{K + F(s)}{\frac{1}{G}} \quad (2)$$

$$\text{at } a = 1 \quad \frac{U_0}{U_1} = \frac{K}{\frac{1}{G} + F(s)} \quad (3)$$

Thus, whatever frequency dependence is represented by equation (2), the opposite is represented by equation (3). Hence, if the term $F(s)$ is chosen so that equation (2) represents a gain rising with increasing frequency function, then equation (3) represents a gain falling transfer function. In other words, the tone control circuit can be varied between boost and cut. The gain of tone control circuit 10 can be shown to be independent of frequency when:

$$\frac{1-a}{GK} = a \quad (4)$$

and a flat response is obtained at the output of the tone control circuit. As will be explained later, by selecting the frequency characteristics of $F(s)$ of frequency sensitive network 18, tone control circuit 10 can provide boost and cut for treble and bass tone control.

As an example, if tone control circuit 10 is selected for treble tone control and the frequency characteristics of the term $F(s)$ is chosen to be:

$$F(s) = sT \quad (5)$$

and if the gain constants G, K are set to unity then substitution of equation (5) into equation (1), yields a transfer function for tone control circuit 10 of:

$$\frac{U_0}{U_1} = \frac{1 + (1-a)sT}{1 + asT}$$

With:

$$a = 0, \quad \frac{U_0}{U_1} = 1 + sT \quad (7)$$

$$a = .5, \quad \frac{U_0}{U_1} = 1 \quad (8)$$

$$a = 1, \quad \frac{U_0}{U_1} = \frac{1}{1 + sT} \quad (9)$$

Equations (7), (8) and (9) correspond to treble boost, flat, and treble cut respectively, the boost and cut characteristics are symmetrical, i.e., both functions will either increase or decrease at a 6 db/octave rate, as is understood.

In a similar fashion, it can be shown that by selecting $$F(s) = \frac{1}{sT},$$

for different values of the signal splitting factor, a, bass boost, flat, and bass cut will occur. As will be described later, both of the above functions can be accomplished by using a single capacitor as frequency sensitive network 18 and by DC controlling the splitting factor, $a$, of signal splitter circuit 20.

Figure 2:
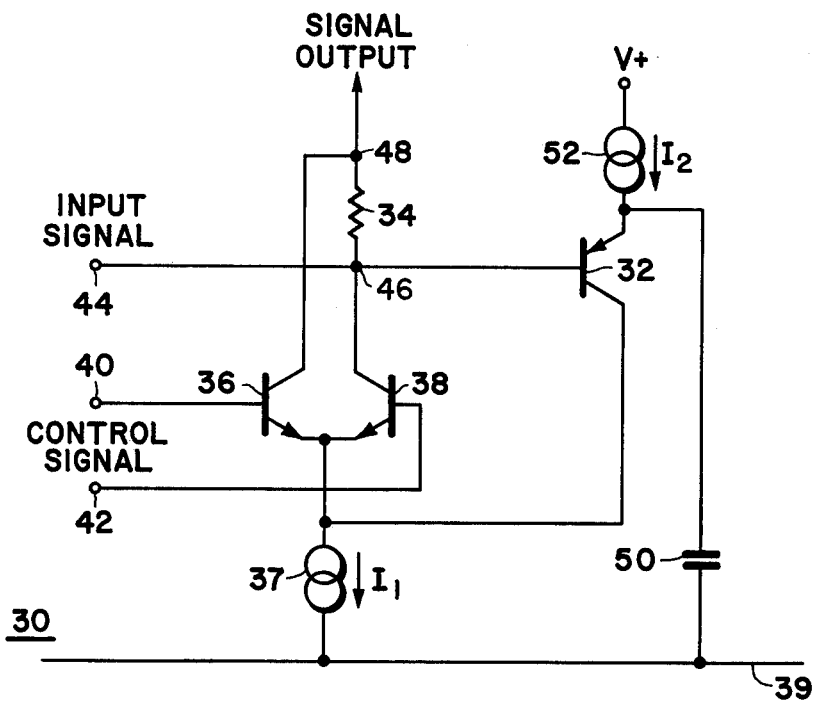
FIG. 2 is a schematic drawing illustrating a tone control circuit of one embodiment of the invention.

Referring now to FIG. 2, there is illustrated tone control circuit 30 suitable to provide control of treble tones (boost and cut) in a manner as discussed for tone control circuit 10. With regards to FIG. 1, generally, amplifier 14 and frequency sensitive network 18 are realized by transistor 32, resistor 34 and capacitor 50 of FIG. 2. Signal splitter circuit 20 is realized by differentially connected transistor pair 36 and 38.

The emitters of differential connected transistors 36 and 38 are coupled through constant current source 37 to a ground or negative supply lead 39 and also to the collector electrode of transistor 32. A DC control signal is applied across respective base electrodes 40 and 42 of transistors 36 and 38. The audio input signal, which is made to be a current signal, is applied to input node 44 at the collector of transistor 38 at node 46, the collector of transistor 38 is also coupled via resistor 34 to the signal output node of the circuit and to the base of transistor 32. It is to be understood that a bias potential is supplied to transistors 36, and 38 in any well known manner. The emitter of transistor 32 is coupled to a supply potential through constant current source 52 and also to capacitor 50 which is returned to the supply lead 39. The collector of transistor 36 is directly coupled to the signal output terminal at node 48 of the treble tone control circuit 30.

In operation, the audio signal input current flows through resistor 34 developing a voltage thereacross which is applied to the base of transistor 32. The voltage at the base of transistor 32 appears substantially unaltered at the emitter thereof causing a frequency dependent current to flow via capacitor 50 and through the emitter of transistor 32. Hence, due to the normal transistor action, the collector current of transistor 32 is also frequency dependent. The collector current of transistor 32 is coupled to the emitters of transistors 36 and 38, where the signal is divided in a ratio dependent upon the applied DC control signal across terminals 40 and 42 respectively. A portion of the frequency dependent current will then appear in the collector of transistor 36 and the other portion thereof will appear in the collector of transistor 38. By adjusting the magnitude of the DC control signal, substantially all of the frequency dependent current can be caused to appear in the collector of transistor 36 which is the aforedescribed feed forward condition. This current will then be added to the input current flowing through resistor 34 at node 48. However, if the magnitude of the DC control signal is adjusted so that all of the frequency dependent current flows in the collector of transistor 38 it can be caused to be subtracted from the input current flowing through resistor 34, which is the abovedescribed feedback condition. Capacitor 50 having a lower reactance at higher frequency (lower impedance at higher frequencies) allows greater current to flow in transistor 32 at high frequencies than at low frequencies. Hence, the frequency dependent currents flowing through transistors 36 and 38 increase as frequency increases and the degree of treble boost or cut increases as the frequency increases.

In an intermediate condition, when the magnitude of the applied DC control signal causes transistors 36 and 38 to equally conduct, the frequency dependent current is then split equally between the two transistors. In this condition, part of the frequency dependent current (from transistor 38) is used as a feedback signal to reduce the overall gain and the other portion of the frequency dependent signal is fed forward (transistor 36) and is added to the signal output at node 48 thus increasing the overall gain. It is evident that tone control circuit 30 under these conditions is in an intermediate state between maximum boost and maximum treble cut. It can be shown that a flat frequency response will be produced under this condition.

Figure 3:
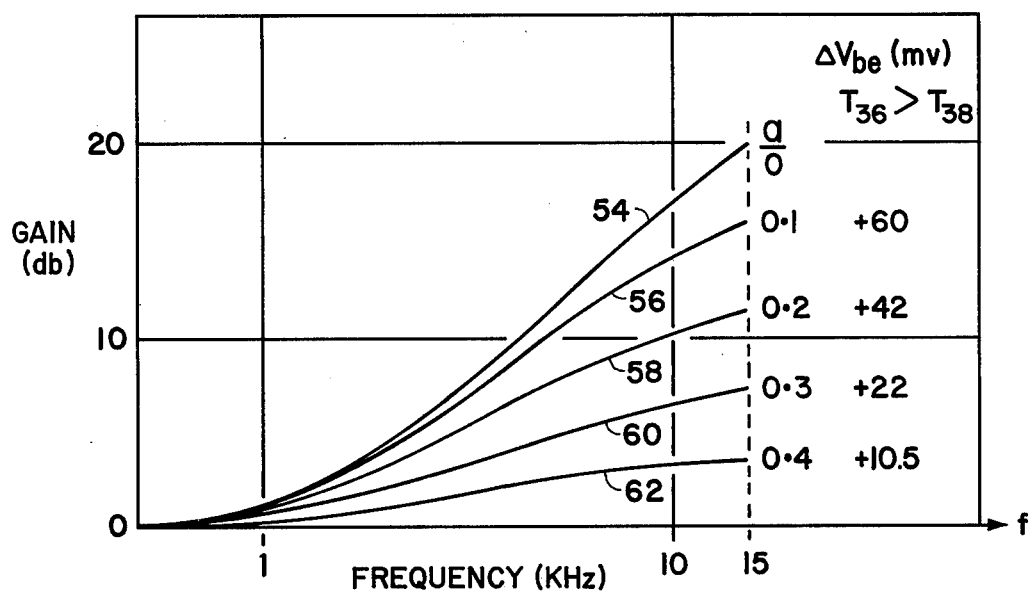
FIG. 3 is a graph illustrating gain versus frequency of the output of a tone control circuit of the embodiment of FIG. 2.

FIG. 3 illustrates treble boost characteristics which can be obtained from the tone control circuit of FIG. 2. The characteristics of treble tone control circuit 30 can be designed for 20 db boost at 15 kHz, which is a typical specification. It is to be understood that the treble cut characteristics are the exact inverse of the treble boost characteristics. The point of inflection (the points where the curve begin to rise at an essentially 6dB/octave rate) are chosen by the designer by the values used for capacitor 50. The graph (waveforms 54–62) of FIG. 3 illustrating gain versus frequency is plotted for different levels of boost and also illustrates the control voltage required across emitter-coupled transistor pair 36 and 38.

Figure 4:
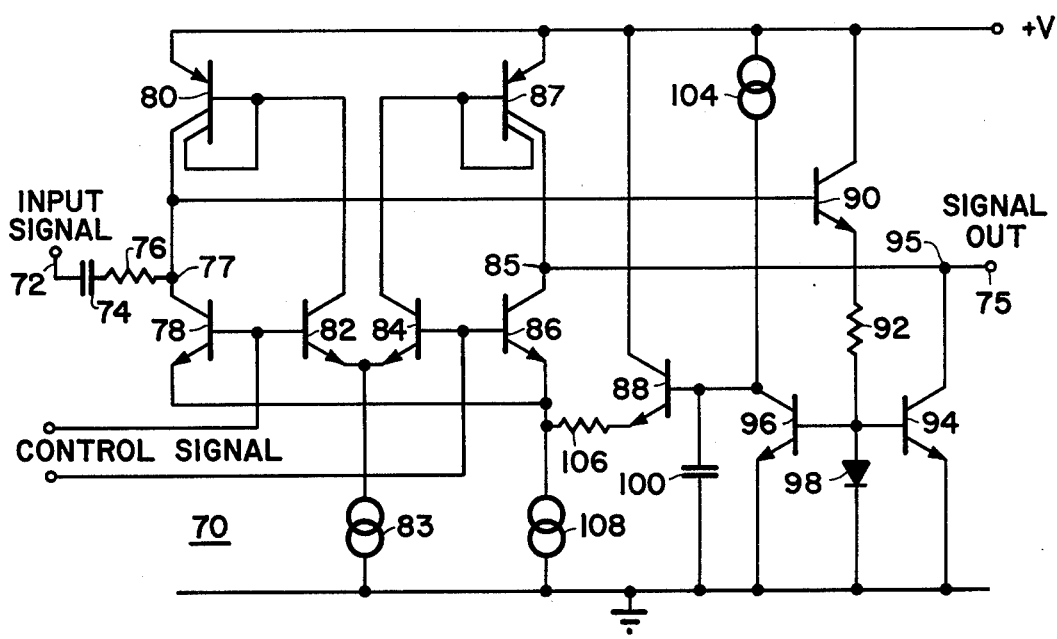
FIG. 4 is a schematic diagram illustrating a tone control circuit of another embodiment of the invention.

Referring to FIG. 4 there is shown a tone control circuit suitable to be utilized for bass tone control. It is to be understood that both the circuit of FIG. 4 and of FIG. 2 are suitable to be fabricated in monolithic integrated circuit form. If such is the case, only the capacitive elements shown need be connected externally to the integrated circuit comprising the two tone control circuits.

In reference to FIG. 1, the input audio signal is applied at terminal 72 and the summing function of the tone control circuit is realized at the base of transistor 90 by addition of the input signal and the feedback signal developed across capacitor 74 and resistor 76. Signal splitter circuit 20 is realized by transistors 78 and 86 which are differentially connected at the emitters thereof and to which the DC control signal is applied across respective bases. Amplifier 14 is realized by the combination of transistors 90, transistor 96, transistor 94 and diode 98. Frequency sensitive circuit 18 corresponds to transistor 88, resistor 106, and capacitor 100.

The input signal applied to tone control circuit 70 is a voltage derived from a relatively low impedance source. The signal developed at output terminal 75 will be a current which may be directly coupled to the input of treble control circuit 30 in an actual high fidelity stereo system.

The applied audio signal at terminal 72 is coupled through capacitor 74 and resistor 76 to the base of transistor 90 and is converted into an alternating current thereby. Diode 98, transistors 94 and 96 are connected as well known current mirror circuits such that the current produced by the applied input signal through transistor 90 via resistor 92 is coupled through to capacitor 100 and to output terminal 75. The voltage developed across capacitor 100 is inversely proportional to the frequency of the applied input audio signal. Thus, the frequency dependent voltage developed across this capacitor, which is applied to the base of transistor 88, produces a current through resistor 106 which is also frequency dependent. The current generated through resistor 106 is applied to the emitters of transistors 78 and 86 in a like manner as to the differential connected transistors 36 and 38 of FIG. 2. Thus, as is understood, frequency dependent currents are developed in the collectors of transistors 78 and 86, the magnitudes of which are dependent on the conductive condition of respective transistors.

In the case of desired full boost, $a = 0$, the applied DC control signal renders transistor 86 fully conductive so that the frequency dependent current flowing therethrough adds to the audio signal derived at the collector of output transistor 94, at junction 95, so that the magnitude of the output audio signal at terminal 75 boosts or amplifies the signal at lower frequencies. In a similar manner as accomplished in FIG. 2, if a cut in bass tones is desired, the control signal is adjusted such that transistor 78 is rendered fully conductive, with transistor 86 being nonconductive, such that the frequency dependent current appearing at the collector thereof subtracts from the applied input audio signal at node 77. Thus the output signal derived at the collector of output transistor 94 will be reduced as a function of frequency. Furthermore, if the D.C. control signal applied to the respective bases of transistors 78 and 86 is of the amplitude to cause both the transistors to equally conduct, then the output response of control circuit 70 remains flat, independent of frequency.

Transistors 82, 84, PNP turn-around transistors 80, 87, and constant current source 83 are required to eliminate variations in the quiescent output current level which would otherwise vary as the current through transistors 78 and 86 varies due to the application of the D.C. control signal. Simultaneously with the current split through transistors 78 and 86, the current provided by constant current source 83 is split between the emitter coupled transistors 82 and 84 in accordance to the polarity of the control signal applied to the bases thereof which also controls the conduction of transistor 78 and 86 respectively. Transistors 82 and 84 serve only for DC compensation and are not in the audio signal path of the frequency dependent current generated in the circuit. The current produced through transistors 82 and 84 is inverted by PNP turn-around transistors 80 and 87 respectively such that transistor 80 absorbs the quiescent current supplied by transistor 78 and the quiescent current supplied by transistor 86 is absorbed by transistor 87. Hence, no component of the quiescent current flowing in transistors 78 and 86 flows in the output lead and hence the quiescent current in the output does not vary as the quiescent currents in transistors 78 and 86 are varied to control the circuits frequency response. Transistors 78, 82, 84 and 86 may be well matched, as is understood by fabricating the control circuit in monolithic integrated circuit form. Equality of the quiescent currents at node 77 is assured by the operation of the feedback loop formed by transistor 90, resistor 92, diode 98, transistors 96 and 88, resistor 106, transistor 78. This is the signal feedback loop previously referenced. However, at signal frequencies the feedback is controlled by the value of resistor 76 while at DC the capacitor 74, being of infinite impedance, greatly increases the effect of said feedback. Capacitor 74 can be made as large as is necessary to avoid disturbing the frequency response in the audio range.

It should be understood that treble control circuit 30 of FIG. 2 and base control circuit 70 of FIG. 4 can be included in a single monolithic chip using integrated circuit techniques such that, for example, for a two channel stereo system both channels can be supplied utilizing only one integrated circuit. In a two channel stereo system all that would be required, other than the usual AC coupling capacitors, is for the external capacitors comprising the frequency sensitive network to be connected to appropriate leads of the integrated chip comprising the tone control circuits, as discussed above. As described, to vary the treble and bass frequency response requires only two individual potentiometers which are respectively coupled to the bases of differentially connected transistor pairs 36, 38 and 78, 86 which are adjusted to vary the DC control signal applied to the separate tone control circuits.

One particular advantage of the above described tone control circuits is that they are readily adaptable to be utilized with a remote control system whereby a listener can remotely adjust the treble and bass frequency response. Thus, a hand held remote control transmitter should be used to both control the volume and the tone of the stereo system. Therefore a listener could sit in any position he desires and be able to adjust the sound being reproduced.

Moreover, the potentiometers controlling the boost and cut of the above described circuits are not in the audio signal path as are such potentiometers of the prior art. Therefore, layout problems for high fidelity sound systems utilizing the present embodiments are not significant.

Furthermore, the number of components required to provide tone control has been significantly reduced by the disclosed tone control circuits over the prior art.

What is claimed is:

1. In an electronic circuit for receiving, and processing an audio signal, a control circuit for varying the frequency response of the electronic circuit, comprising:
    means responsive to the audio signal for producing a signal of which the magnitude thereof is dependent on the frequency of the audio signal;
    circuit means, coupled to said means for producing a frequency dependent signal, which is adapted to receive an externally supplied control signal, for electronically dividing said frequency dependent signal into a feedback and a feed forward signal, the ratio of said feedback signal to said feed forward signal being varied in accordance with the magnitude of said control signal;
    means for combining said feedback signal with said audio signal to vary the frequency response of the electronic circuit in a first prescribed manner; and
    means for combining said feed forward signal with the audio signal to vary the frequency response of the electronic circuit in a second prescribed manner.

2. The control circuit of claim 1 wherein said circuit means for producing a feed forward and feedback signal includes:
    first electron control means having first, second and control electrodes, said control electrode being adapted to receive said direct current control signal, said second electrode being coupled to the output of the electronic circuit;
    second electron control means having first, second, and control electrodes, said control electrode being adapted to receive said direct current control signal, said first electrode being connected to said first electrode of said first electron control means said second electrode being coupled to the output terminal of the electronic circuit; and
    current source means connected to said first electrodes of said first and second electron control means.

3. The control circuit of claim 2 wherein said means for producing a frequency dependent signal includes:
    third electron control means having first, second and control electrodes, said first electrode being coupled to current source means, said control electrode being connected to said second electrode of said second electron control means, said second electrode being coupled to said first electrodes of said first and second electron control means;

circuit means coupling said second electrode of said second electron control means to the output terminal of the electronic circuit; and capacitive means coupled between said first electrode of said third electron control means and a ground reference terminal.

4. The control circuit of claim 2 wherein said means for producing a frequency dependent signal includes:

third electron control means having first, second and control electrodes, said control electrode being connected to said second electrode of said second electron control means and being adapted to receive the audio signal, said second electrode being coupled to a source of operating potential;

first circuit means coupled between said first electrode of said third electron control means and a ground reference terminal;

capacitive means coupled to said first circuit means and to said ground reference terminal;

second circuit means coupled between said first electrodes of said first and second electron control means and said capacitive means.

5. The control circuit of claim 4 further including output amplifier means having first, second and output electrodes, said first electrodes being coupled to said ground reference terminal, said second electrode being coupled to said first circuit means, and said output electrode being coupled respectively to said second electrode of said first electron control means and to the output of the electronic circuit.

6. The control circuit of claim 4 wherein:

said first circuit means includes a first resistive means serially connected with a diode between said first electrode of said first electron control means and said ground reference terminal; and said second circuit means includes a second resistive means and fourth electron control means.

7. A tone control circuit suitable to be provided in a high fidelity sound reproduction system or the like for controlling treble and bass tones, comprising:

frequency sensitive circuit means responsive to an applied audio signal for developing at an output thereof a signal having a magnitude which varies with frequency;

means adapted to receive a direct current control signal and said signal from said frequency sensitive circuit means for producing first and second differential signals at respective output terminals thereof including a pair of differentially connected transistors, the base electrodes of said transistors being adapted to receive said direct current control signal thereacross, the connected emitter electrodes of said transistors being adapted to receive the frequency dependent signal from said frequency sensitive circuit means, the collector electrode of the first one of said transistors being directly connected to the output of the tone control circuit and the collector electrode of the second one of said transistors being coupled both to the output of the tone control circuit and to the input thereof, the ratio of the magnitudes of said first and second differential signals being controlled by said direct current control signal; and said first and second differential signals being selectively combined with the audio signal to vary the frequency response at the output of the tone control circuit to adjust the tone of the audio signal accordingly.

8. The tone control circuit of claim 7 wherein said frequency sensitive circuit means includes:

a third transistor having the base electrode thereof connected to said collector electrode of said second transistor, the emitter electrode coupled to first current source means and the collector electrode coupled to said emitter electrodes of said first and second transistors;

first circuit means coupled between the base electrode of said third transistor and the output of the tone control circuit; and capacitive means coupled between the emitter electrode of said third transistor and a reference terminal.

9. The tone control circuit of claim 7 wherein said frequency sensitive circuit means includes:

third transistor means having a base electrode coupled to the input of the tone control circuit and to said collector electrode of said second transistor, the collector electrode connected to a source of bias potential;

first circuit means coupled between said emitter electrode of said third transistor and a second bias potential;

capacitive means coupled to said first circuit means and to said second bias potential; and second circuit means coupled between said capacitive means and said connected emitters of said differentially connected transistors.

10. The tone control circuit of claim 9 further including an output transistor having the base electrode connected to said first circuit means, the emitter electrode connected to said second bias potential and the collector electrode coupled to the output of the tone control circuit.

11. The tone control circuit of claim 9 wherein said first circuit means includes:

first resistive means connected at one end thereof to said emitter electrode of said third transistor; and diode means connected between the other end of said resistive means and said second bias potential.

12. The tone control circuit of claim 11 wherein said second circuit means includes:

a fourth transistor having the base electrode connected to said capacitive means, said collector electrode coupled to said bias potential; and second resistive means connected between the emitter electrode of said fourth transistor and said emitters of said differentially connected transistors.

13. The tone control circuit of claim 12 including:

a fifth transistor having the base electrode connected to the junction point between said first resistive means and said diode means, the emitter electrode connected to said second bias potential and the collector electrode coupled to said capacitive means and to a current source means and output driver means including electron control means having first, second and control electrodes, said control electrode being connected to said junction point, said first electrode being coupled to said second bias potential and said second electrode being connected to the output terminal of the tone control circuit.

14. A tone control circuit suitable to be fabricated in monolithic integrated circuit form for providing tone control in a sound reproduction system including an input terminal adapted to receive an audio signal, an output terminal, and an additional terminal adapted to be connected to a reactive component, comprising:

first circuit means, coupled to the additional terminal, which in conjunction with the reactive component is responsive to the audio signal for producing a signal the magnitude of which is dependent on the frequency of the audio signal;

second circuit means adapted to receive a direct current control signal and being coupled to said first circuit means for electronically producing first and second differential frequency dependent signals at respective outputs thereof, the ratio of the magnitude of said first and second differential signals being controlled by said direct current control signal said outputs being coupled respectively to the input and output terminals of the tone control circuit such that said first and second differential signals are combined with the audio signal to vary the frequency response of the tone control circuit in a prescribed manner.

15. The tone control circuit of claim 14 wherein said second circuit means includes:

first electron control means having first, second and control electrodes, said control electrode being adapted to receive said direct current signal, said second electrode being connected to the output terminal of the tone control circuit; and second electron control means having first, second and control electrodes said control electrode being adapted to receive said direct current control signal, said first electrode being connected to said first electrode of said first electron control means, said second electrode being coupled to the output terminal of the tone control circuit.

16. The tone control circuit of claim 15 wherein said first circuit means includes:

third electron control means having first, second and control electrodes, said first electrode being coupled to current source means, said second electrode being coupled to said first electrodes of said first and second electron control means, said control electrode being coupled to said second electrode of said second electron control means, and to the input terminal of the tone control circuit, said first electrode also being adapted to be connected to the reactive component; and first resistive means coupled between said base electrode of the third electron control means and the output terminal of the tone control circuit.

17. The tone control circuit of claim 15 wherein said first circuit means includes:

third electron control means having first, second and control electrodes, said control electrode being coupled to said second electrode of said second electron control means and to the input terminal of the tone control circuit, said second electrode being coupled to said first bias potential;

first circuit means coupling said first electrode of said third electron control means to a second bias potential;

second circuit means coupled to said first circuit means and being adapted to be connected to the reactive component; and third circuit means adapted to be connected to the reactive component and to said first electrodes of said first and second electron control means.

18. The tone control circuit of claim 17 including fourth electron control means having first, second and control electrodes, said first electrode being connected to said second bias potential, said second electrode being connected to the output terminal of the tone control circuit and to said second electrode of said first electron control means, and said control electrode being coupled to said first circuit means.

* * * * *